(12) United States Patent
Shah et al.

(10) Patent No.: US 8,601,975 B2
(45) Date of Patent: Dec. 10, 2013

(54) METHODS AND LOADPORT APPARATUS FOR PURGING A SUBSTRATE CARRIER

(75) Inventors: Vinay K. Shah, San Mateo, CA (US); Eric Englhardt, Palo Alto, CA (US); Jeffrey C. Hudgens, San Francisco, CA (US); Martin R. Elliott, Pepperell, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/287,534

(22) Filed: Nov. 2, 2011

(65) Prior Publication Data

US 2012/0060971 A1 Mar. 15, 2012

Related U.S. Application Data

(62) Division of application No. 11/622,300, filed on Jan. 11, 2007, now Pat. No. 8,074,597.

(60) Provisional application No. 60/758,152, filed on Jan. 11, 2006.

(51) Int. Cl.
*H01L 21/306* (2006.01)
*B05C 13/00* (2006.01)
*B05C 13/02* (2006.01)

(52) U.S. Cl.
USPC .......... 118/500; 414/935; 414/937; 206/710; 206/711; 206/712

(58) Field of Classification Search
USPC ............ 118/500, 715, 719, 733; 156/345.31; 414/935, 937; 206/710–712
See application file for complete search history.

(56) References Cited

U.S. PATENT DOCUMENTS

| 5,988,233 A | 11/1999 | Fosnight et al. |
| 6,123,120 A | 9/2000 | Yotsumoto et al. |
| 6,199,604 B1 | 3/2001 | Miyajima |
| 6,955,197 B2 | 10/2005 | Elliott et al. |
| 7,051,870 B2 | 5/2006 | Schoendienst et al. |
| 2001/0042439 A1 | 11/2001 | Roberson et al. |
| 2003/0009904 A1 | 1/2003 | Tokunaga |

(Continued)

FOREIGN PATENT DOCUMENTS

| EP | 0219826 B1 | 9/1994 |
| EP | 0472536 B1 | 12/1994 |

(Continued)

OTHER PUBLICATIONS

Shah et al., U.S. Appl. No. 13/605,927, filed Sep. 6, 2012.

(Continued)

*Primary Examiner* — Karla Moore
(74) *Attorney, Agent, or Firm* — Dugan & Dugan, PC

(57) ABSTRACT

In a first aspect, a loadport is provided. The loadport has a plate adapted to couple to a door of a substrate carrier to open the substrate carrier wherein the plate includes a first opening adapted to couple to a first port in the door of the substrate carrier on a first side of the plate and to couple to a gas source on a second side of the plate, and wherein the loadport is adapted to allow a flow of gas into the substrate carrier via the first opening in the plate. Methods of purging substrate carriers are provided, as are numerous other aspects.

12 Claims, 9 Drawing Sheets

(56) References Cited

U.S. PATENT DOCUMENTS

| | | |
|---|---|---|
| 2003/0213143 A1 | 11/2003 | Shih et al. |
| 2004/0055650 A1* | 3/2004 | Inoue et al. ............ 137/565.23 |
| 2005/0077204 A1 | 4/2005 | Sumi et al. |
| 2005/0105997 A1 | 5/2005 | Englhardt et al. |
| 2006/0061979 A1 | 3/2006 | Elliott et al. |
| 2006/0072992 A1 | 4/2006 | Elliott et al. |
| 2007/0057322 A1 | 3/2007 | Elliott et al. |
| 2007/0141280 A1 | 6/2007 | Rice |
| 2007/0158183 A1 | 7/2007 | Shah et al. |
| 2009/0110518 A1 | 4/2009 | Rice et al. |

FOREIGN PATENT DOCUMENTS

| | | |
|---|---|---|
| EP | 0651429 A1 | 5/1995 |
| EP | 0556193 B1 | 12/1995 |
| EP | 0663686 B1 | 6/1997 |
| EP | 0684631 B1 | 4/1998 |
| EP | 0555891 B1 | 1/1999 |
| JP | 08046005 | 2/1996 |
| JP | 08-203993 | 8/1996 |
| JP | 08-330208 | 12/1996 |
| JP | 11-214479 | 8/1999 |
| JP | 2000-124300 | 4/2000 |
| JP | 2002-184831 | 6/2002 |
| JP | 2005-327815 | 11/2005 |
| KR | 2003-0007014 | 1/2003 |
| TW | 480546 | 3/2002 |
| WO | WO 97/03001 A1 | 1/1997 |
| WO | WO 98/50946 A1 | 11/1998 |
| WO | WO 99/28952 A2 | 6/1999 |
| WO | WO 99/57940 A2 | 11/1999 |
| WO | WO 00/19493 A2 | 4/2000 |
| WO | WO 00/44653 A1 | 8/2000 |
| WO | WO 00/59004 A1 | 10/2000 |
| WO | WO 01/01828 A1 | 1/2001 |
| WO | WO 01/10756 A1 | 2/2001 |
| WO | WO 02/04774 A2 | 1/2002 |
| WO | WO 2004038789 | 5/2004 |
| WO | WO 2007/082031 A2 | 7/2007 |

OTHER PUBLICATIONS

Kobayashi, et al., "Particle Characteristics of 300-mm Minienvironment (FOUP and LPU)", 1999, Proceedings of 1999 IEEE International Symposium on Semiconductor Manufacturing Conference Proceedings, pp. 39-42.

No-Author, "300mm Single-Wafer Handling" (Brief Article), Apr. 1, 2000, Solid State Technolgy, vol. 43, No. 4, p. 99.

International Search Report and Written Opinion of International Application No. PCT/US07/00722 mailed Aug. 24, 2007.

International Search Report and Written Opinion of International Application No. PCT/US07/00722 mailed Oct. 2, 2007.

International Preliminary Report on Patentability of International Application No. PCT/US07/00722 mailed Jul. 24, 2008.

Office Action of U.S. Appl. No. 11/622,300 mailed Feb. 3, 2011.

May 3, 2011 Response to Office Action of U.S. Appl. No. 11/622,300 mailed Feb. 3, 2011.

Final Office Action of U.S. Appl. No. 11/622,300 mailed Jul. 13, 2011.

Aug. 4, 2011 Response to Final Office Action of U.S. Appl. No. 11/622,300 mailed Jul. 13, 2011.

Interview Summary of U.S. Appl. No. 11/622,300 filed Aug. 12, 2011.

Notice of Allowance of U.S. Appl. No. 11/622,300 mailed Aug. 24, 2011.

Taiwanese Search Report, Application No. 96101142 dated Apr. 17, 2012.

Office Action of U.S. Appl. No. 13/605,927 mailed Apr. 11, 2013.

Jun. 26, 2013 Reply to Apr. 11, 2013 Office Action of U.S. Appl. No. 13/605,927.

Final Office Action of U.S. Appl. No. 13/605,927 mailed Sep. 19, 2013.

* cited by examiner

METHODS AND LOADPORT APPARATUS FOR PURGING A SUBSTRATE CARRIER

This application is a division of, and claims priority to, U.S. Non-provisional patent application Ser. No. 11/622,300, filed Jan. 11, 2007, and titled "METHODS AND APPARATUS FOR PURGING A SUBSTRATE CARRIER", which claims priority to U.S. Provisional Patent Application Ser. No. 60/758,152, filed Jan. 11, 2006, and titled "METHODS AND APPARATUS FOR PURGING A SUBSTRATE CARRIER"Each of these patent applications is hereby incorporated by reference herein in their entirety for all purposes.

FIELD OF THE INVENTION

The present invention relates generally to semiconductor device fabrication systems, and is more particularly concerned with transportation of substrates within a fabrication facility.

BACKGROUND OF THE INVENTION

Manufacturing of semiconductor devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required to be performed at many different processing locations within the fabrication facility.

It is conventional to transport substrates from one processing location to another within substrate carriers such as sealed pods, cassettes, containers and so forth. To prevent damage to substrates transported within substrate carriers, care should be taken to ensure that substrates are not contaminated during transport with the substrate carriers. Methods and apparatus for reducing the contamination of substrates within a substrate carrier are desired.

SUMMARY OF THE INVENTION

In some aspects, the present invention provides a substrate carrier that includes an enclosure adapted to be sealable and to house at least one substrate; and a first port leading into the enclosure adapted to allow a flow of gas into the enclosure while the substrate carrier is closed.

In other aspects, the present invention provides a loadport that includes a plate adapted to couple to a door of a substrate carrier to open the substrate carrier. The plate includes a first opening adapted to couple to a first port in the door of the substrate carrier on a first side of the plate and to couple to a gas source on a second side of the plate. The loadport is adapted to allow a flow of gas into the substrate carrier via the first opening in the plate.

In yet other aspects, the present invention provides a method that includes flowing a gas into a substrate carrier to create a pressure inside the substrate carrier greater than a pressure outside the substrate carrier; and opening a door of the substrate carrier to allow the gas to flow out of the substrate carrier via a door opening.

In still other aspects, the present invention provides a method that includes flowing inert gas into a closed substrate carrier containing substrates; exhausting air from the substrate carrier; and sealing the substrate carrier once the air has been substantially replaced by the inert gas.

In still yet other aspects, the present invention provides a method that includes evacuating air from a closed substrate carrier containing substrates; and sealing the substrate carrier once the air has been substantially removed from the substrate carrier. Numerous other aspects are provided.

Other features and aspects of the present invention will become more fully apparent from the following detailed description of exemplary embodiments, the appended claims and the accompanying drawings.

DETAILED DESCRIPTION

Figure 1:
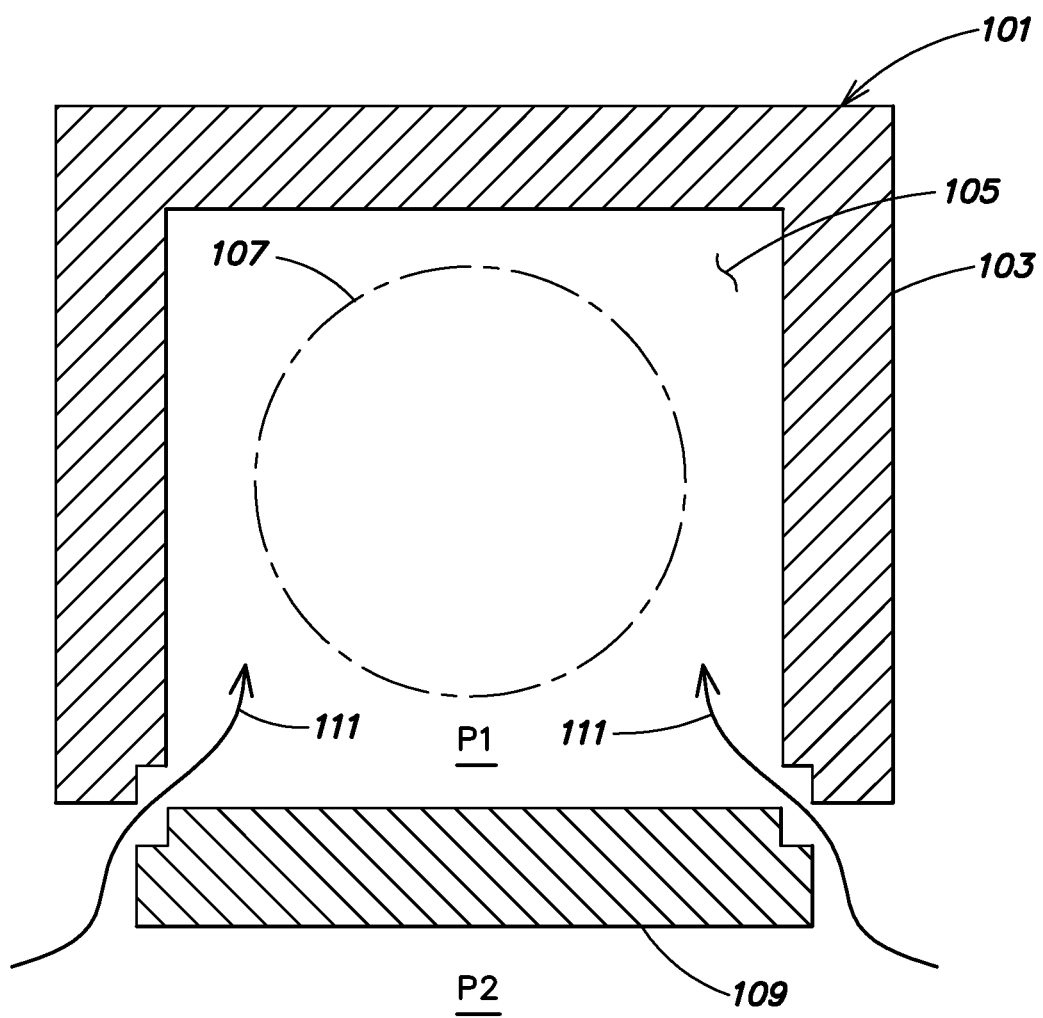
FIG. 1 is cross-sectional top view of a conventional substrate carrier.

During semiconductor device manufacturing, one or more substrates may be transported inside a conventional substrate carrier. However, opening a door of a conventional substrate carrier may adversely affect semiconductor device manufacturing. For example, FIG. 1 is cross-sectional top view of a conventional substrate carrier 101. With reference to FIG. 1, the conventional substrate carrier 101 includes an enclosure 103 for defining a storage area 105 in which one or more substrates 107 (shown in phantom) may be stored. A door 109 is provided that may be used for sealing the substrate carrier 101 by sealing against the enclosure 103. In this manner, the door 109 may separate a first environment within the substrate carrier 101 from a second environment outside the substrate carrier 101.

During a typical semiconductor device manufacturing process, the pressure P1 inside the substrate carrier 101 is the same as the pressure P2 (e.g., ambient pressure) outside the substrate carrier 101. Accordingly, when the door 109 is opened to insert a substrate into and/or extract a substrate from the substrate carrier 101, the pressure P1 in the substrate carrier 101 decreases (due to the outward motion of the door 109) and gas (e.g., ambient air) from outside the substrate carrier 101 flows into the substrate carrier 101. FIG. 1 illustrates an exemplary flow 111 of such gas into the substrate carrier 101.

Because the environment outside the substrate carrier 101 may contain contaminants, allowing flow of the gas into the substrate carrier 101 may introduce contaminants to any substrates within the substrate carrier 101. In accordance with the present invention, gas (e.g., purging gas) is flowed into a substrate carrier before, during and/or after opening a door of the carrier so as to reduce and/or prevent gas outside of the substrate carrier from entering the substrate carrier as the substrate carrier is opened. Details of the present invention are described below with reference to FIGS. 2-7.

Figure 2:
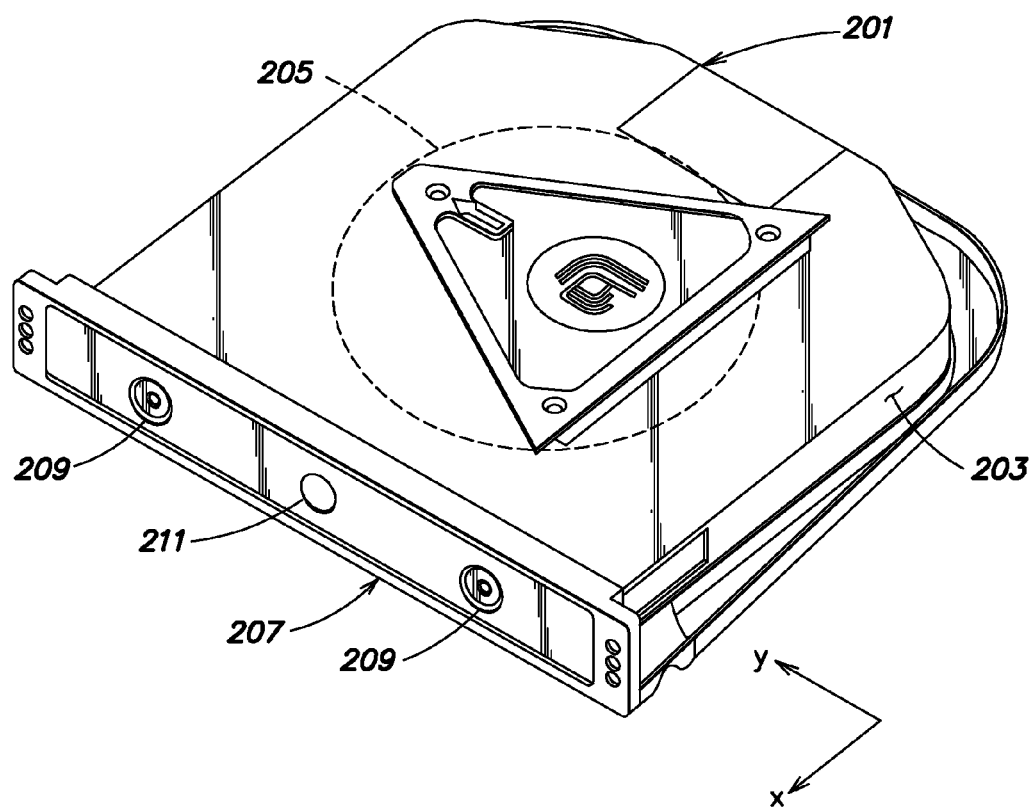
FIG. 2 is an isometric view of a substrate carrier in accordance with an embodiment of the present invention.

FIG. 2 is an isometric view of a substrate carrier 201 in accordance with an embodiment of the present invention. With reference to FIG. 2, the substrate carrier 201 includes an enclosure 203 for defining a storage area (not shown in FIG. 2; 601 in FIG. 6) in which one or more substrates 205 may be stored. The substrate carrier 201 includes a door 207 that may be used to seal the substrate carrier 201 relative to the enclosure 203. The door 207 may separate a first environment within the substrate carrier 201 from a second environment outside the substrate carrier 201.

The substrate carrier 201 includes one or more purge ports 209 adapted to allow a flow of gas, such as air (e.g., clean dry air), N$_2$, argon, another inert gas or the like, into the substrate carrier 201 before, during and/or after the door 207 is opened (e.g., moved along the x-axis). Details of the one or more purge ports are described below with reference to FIG. 3A.

The substrate carrier 201 includes one or more exhaust ports 211 for expelling gas from the substrate carrier 201 (e.g., gas provided to the substrate carrier 201 via the purge ports 209 while the door 207 is being removed). In this manner, the one or more exhaust ports 211 may prevent over-pressurization of the substrate carrier 201. In the embodiment of FIG. 2, the purge ports 209 and the exhaust port 211 are located on the door 207. However, the purge ports 209 and/or exhaust port 211 may be positioned differently. For example, in some embodiments, the enclosure 203 may include one or more purge ports 209 and/or one or more exhaust ports 211. Further, the substrate carrier 201 may include a larger or smaller number of purge ports 209 and/or exhaust ports 211. In some embodiments, a filter 309' (FIG. 3B) may be coupled to an exhaust port 211 such that a gas flowing through the exhaust port 211 passes through and is filtered by the filter before exiting the substrate carrier 201 (e.g., so as to prevent any contaminants within the substrate carrier 201 from escaping). Each purge port 209 similarly may include a filter (as described below).

Figure 3A:
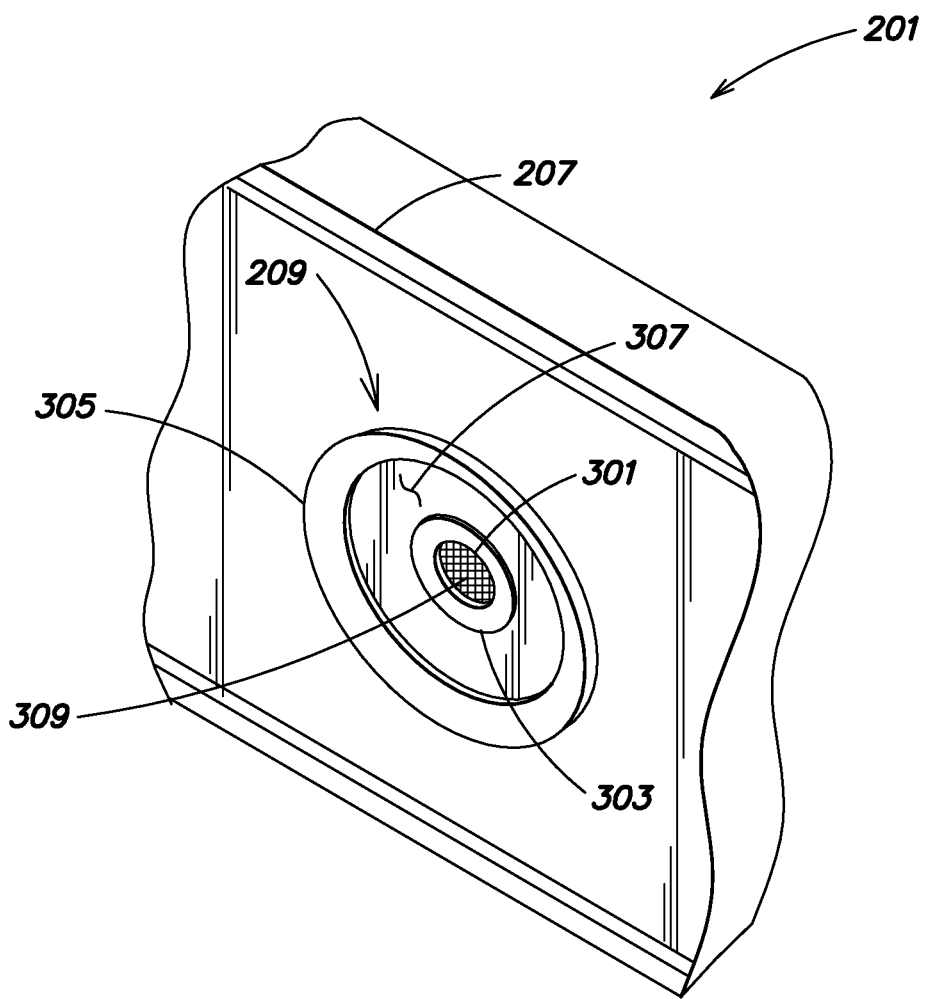
FIG. 3A is an isometric view of a purge port in accordance with an embodiment of the present invention.

FIG. 3A is an isometric view of a purge port 209 in accordance with an embodiment of the present invention. With reference to FIG. 3A, the purge port 209 includes a center opening (e.g., hole) 301 adapted to pass a flow (e.g., one-way flow) of gas into the substrate carrier 201. A filter 309 may be coupled to the center opening 301 such that a gas flowing through the center opening 301 passes through the filter 309 before entering the substrate carrier 201. Although, the center opening 301 of the substrate carrier 201 is shown as a hole, other shapes may be employed for the center opening 301.

The purge port 209 may include a first seal 303, such as an O-ring, suction cup or the like, surrounding the center opening 301. The first seal 303 surrounding the center opening 301 ensures a proper seal between the center opening 301 and an upstream source of gas that flows through the center opening 301.

In embodiments in which the purge port 209 is included in the substrate carrier door 207, when gas (e.g., pressurized gas) flows through the center opening 301 (e.g., and through the filter) a force pushing the door 207 in the direction of the gas flow (e.g., away from the source of the gas flow) is exerted on the door 207. Therefore, the purge port 209 includes a second seal 305 (e.g., O-ring, suction cup or the like) around the first seal 303 that defines an area 307 concentric to the center opening 301 between the first and second seals 303, 305. A vacuum force may be applied to the concentric area 307 to counteract the force exerted on the door 207 while inserting gas into the substrate carrier 201. The concentric area 307 and area of the center opening 301 are dimensioned such that the vacuum force applied to the concentric area 307 is greater than the force applied to the door 207 by the flow of gas into the substrate carrier 201. Further, concentricity of the area 307 and the center opening 301 ensures that resulting moment loads are substantially zero.

Figure 3B:
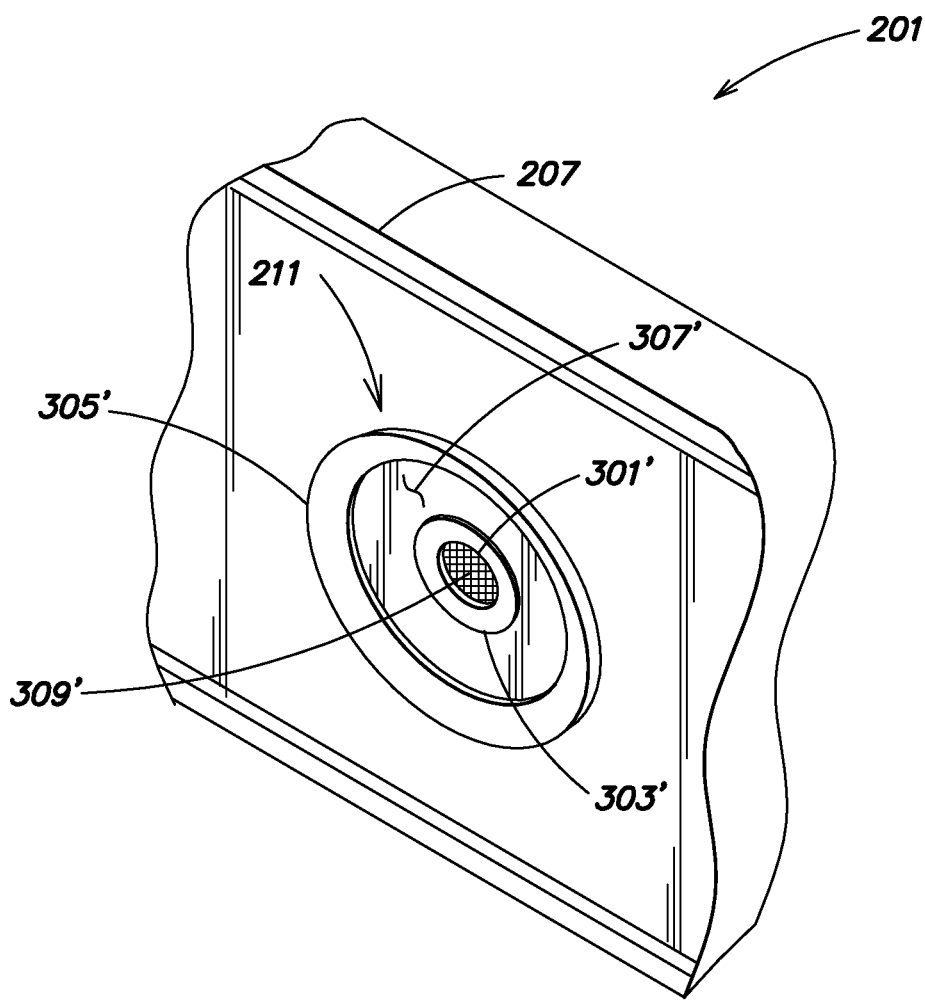
FIG. 3B is an isometric view of an exhaust port in accordance with an embodiment of the present invention.

In some embodiments, the exhaust port 211 may be similar to the purge ports 209. FIG. 3B is an isometric view of an exhaust port 211 in accordance with an embodiment of the present invention. With reference to FIG. 3B, the purge port 211 includes a center opening (e.g., hole) 301' adapted to pass a flow (e.g., one-way flow) of air or gas out of the substrate carrier 201. A filter 309' may be coupled to the center opening 301' such that air flowing through the center opening 301' passes through the filter 309' before exiting the substrate carrier 201. Although, the center opening 301' of the substrate carrier 201 is shown as a hole, other shapes may be employed for the center opening 301'.

The exhaust port 211 may include a first seal 303', such as an O-ring, suction cup or the like surrounding the center opening 301'. The first seal 303' surrounding the center opening 301' ensures a proper seal between the center opening 301' and an exhaust channel used to carry air/gas that flows through the center opening 301'.

In embodiments in which the exhaust port 211 is included in the substrate carrier door 207, when air or gas (e.g., pressurized gas) flows through the center opening 301' (e.g., and through the filter) a force pushing the door 207 in the direction of the gas flow (e.g., away from the substrate carrier 201) is exerted on the door 207. Therefore, the exhaust port 211 includes a second seal 305' (e.g., O-ring, suction cup or the like) around the first seal 303' that defines an area 307' concentric to the center opening 301' between the first and second seals 303', 305'. A vacuum force may be applied to the concentric area 307' to counteract the force exerted on the door 207 while removing air or gas from the substrate carrier 201. The concentric area 307' and area of the center opening 301' are dimensioned such that the vacuum force applied to the concentric area 307' is greater than the force applied to the door 207' by the flow of air or gas out of the substrate carrier 201. Further, concentricity of the area 307' and the center opening 301' ensures that resulting moment loads are substantially zero. Other purge port and/or exhaust port configurations may be used.

Figure 4A:
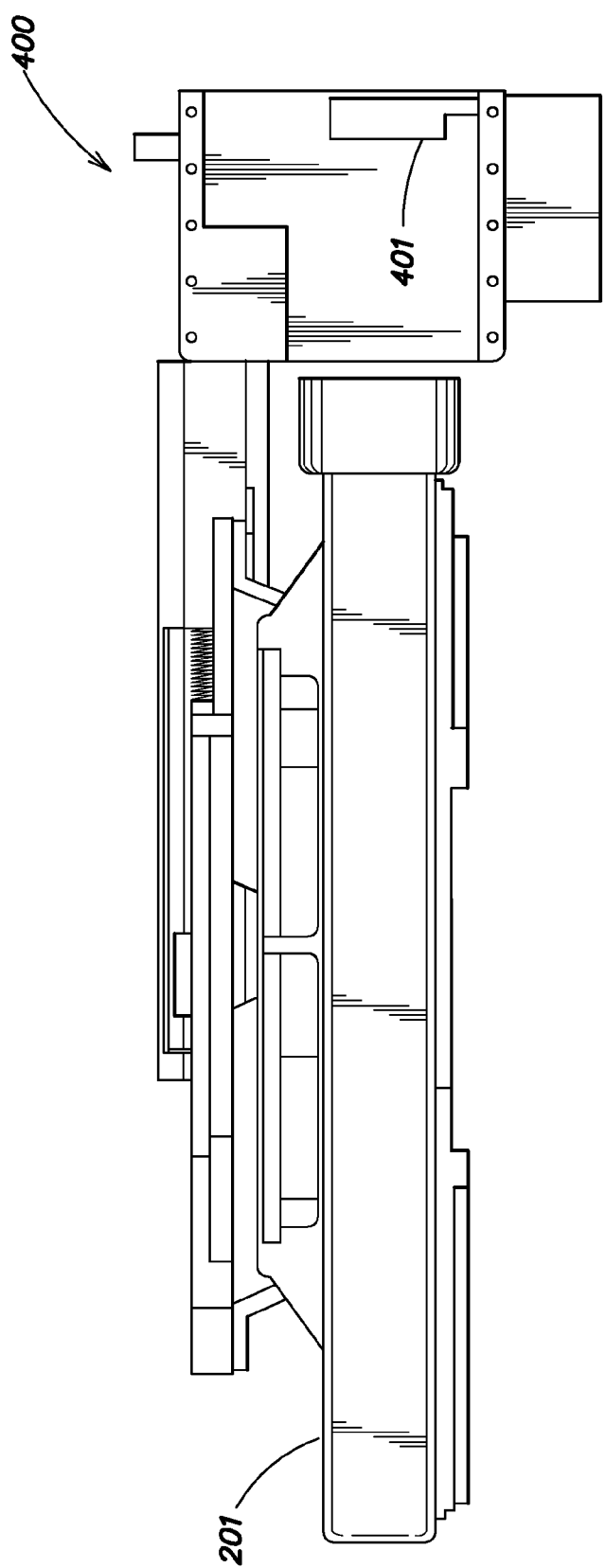
FIG. 4A is a plan side view of a loadport and a substrate carrier in accordance with an embodiment of the present invention.

Turning to FIG. 4A, during semiconductor device manufacturing, a substrate carrier 201 may be supported by a loadport 400 or similar supporting structure and a substrate may be inserted into or extracted from the substrate carrier 201. For example, the loadport 400 may include a plate 401 or similar structure for opening a substrate carrier door 207 (FIG. 2) as described below with reference to FIG. 4B.

Figure 4B:
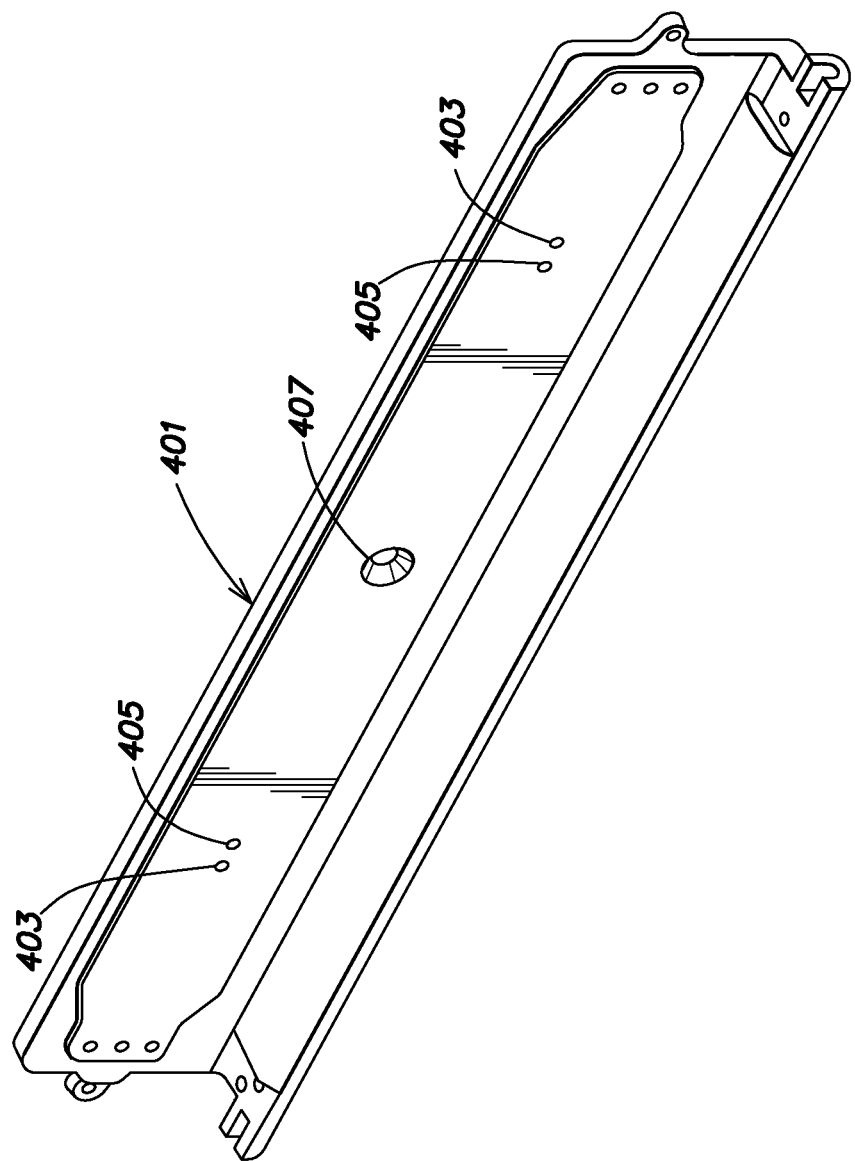
FIG. 4B is an isometric front view of a plate for opening a substrate carrier door in accordance with an embodiment of the present invention.

FIG. 4B is an isometric front view of an exemplary plate 401 for opening a substrate carrier door 207 in accordance with an embodiment of the present invention. With reference to FIGS. 4A and 4B, the plate 401 may be included in a loadport 400. The plate 401 is adapted to couple to a substrate carrier door 207 which is supported by (e.g., docked in) the loadport 400.

The plate 401 includes a purge opening (e.g., hole) 403 corresponding to each center opening 301 of each purge port 209 included in a door 207 to which the plate 401 is to be coupled. Each purge opening 403 is adapted to mate with a center opening 301 of a door 207 such that the first seal 303 of the center opening 301 forms a seal around the purge opening 403, and therefore, between the center opening 301 and corresponding purge opening 403. The purge opening 403 is adapted to deliver purge gas to the center opening 301. Although the purge opening 403 is shown as a hole, other shapes may be employed for the purge opening 403. Further, in some embodiments, a nipple or similar structure (not shown) may couple to or replace the purge opening 403 such that the nipple mates with the center opening 301 of the purge port 209 when the door 207 is coupled to the front of the plate 401.

Similarly, the plate 401 may include a vacuum opening (e.g., hole) 405 corresponding to each concentric area 307 of the one or more purge ports 209 included in the door 207 to which the plate 401 is adapted to couple. An area of the plate 401, which is around the vacuum opening 405, couples to the second seal 305 of a door 207, thereby forming a sealed volume between the plate 401, door 207, and first and second seals 303, 305. The vacuum opening 405 is adapted to deliver a vacuum to such volume. Although the vacuum opening 405 is shown as a hole, other shapes may be employed for the vacuum opening 405. Further, although the first and second seals 303, 305 are included in the door 207, in some embodiments, the first and/or second seal 303, 305 may be included in the plate 401.

The plate includes an exhaust opening (e.g., hole) 407 corresponding to each exhaust port 211 included in the door 207. The exhaust opening 407 is adapted to expel air or gas from the substrate carrier 201. In embodiments in which an exhaust port 211 includes a (concentric) vacuum area (e.g., between first and second seals), the plate 401 may include a vacuum opening (not shown) for applying vacuum to the vacuum area of the exhaust port 211. In at least one embodiment, a nipple or similar structure (not shown) may be used in place of the exhaust opening 407 and/or any vacuum opening.

Figure 5:
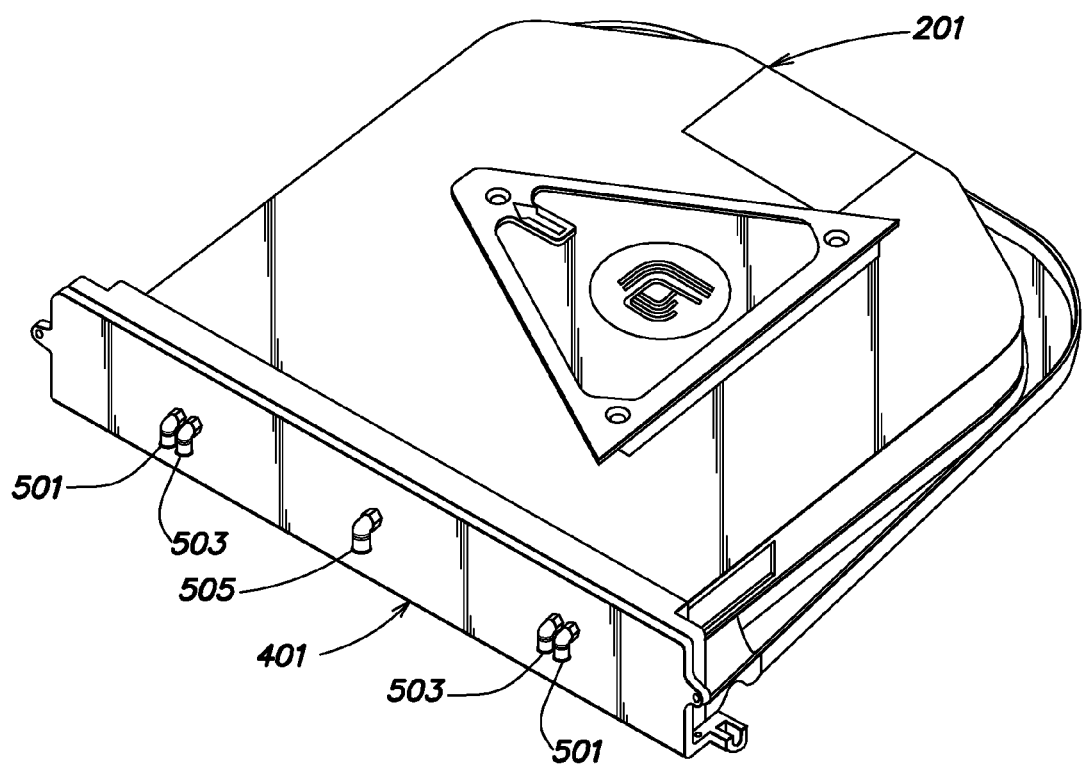
FIG. 5 is an isometric rear view of the plate of FIG. 4B in accordance with an embodiment of the present invention.

FIG. 5 is an isometric rear view of the plate 401 of FIG. 4B coupled to a substrate carrier 201 in accordance with an embodiment of the present invention. With reference to FIG. 5, when a substrate carrier 201 is supported by a loadport 400 (FIG. 4A—not shown in FIG. 5) that employs the plate 401, the door 207 (obstructed in FIG. 5) of the substrate carrier 201 couples (e.g., docks) with the front of the plate 401. The rear of the plate 401 is adapted to couple to a source of gas (e.g., purge gas), vacuum and/or exhaust. More specifically, a gas fitting 501 is coupled to each purge opening 403 (FIG. 4B) on the rear side of the plate 401. Each gas fitting 501 is adapted to deliver gas (e.g., pressurized purge gas such as nitrogen, argon, clean dry air, an inert or nonreactive gas, etc.) into the substrate carrier 201 through the purge opening 403 and center opening 301. Similarly, a vacuum fitting 503 is coupled to each vacuum opening 405 on the rear side of the plate 401. Each vacuum fitting 503 is adapted to deliver a vacuum to the sealed volume formed between the plate 401, door 207, and first and second seals 303, 305. In at least one embodiment, the vacuum delivered to the sealed volume may be greater than the force exerted by the gas flow into the center opening 301 of the door 207 (e.g., while opening the substrate carrier door 207). In this manner, the plate 401 remains coupled to the substrate carrier door 207 while gas flows through the center opening 301 into the substrate carrier 201 (e.g., as the plate 401 opens the door 207).

Further, an exhaust fitting 505 is coupled to each exhaust opening 407 (FIG. 4B) on the rear side of the plate 401. Each exhaust fitting 505 is adapted to expel one or more gases from the substrate carrier 201. Note that if the enclosure 203 includes one or more purge ports 209 and/or one or more exhaust ports 211, a corresponding fitting(s) may couple to each such port on the enclosure 203. Further, if the exhaust port 211 includes a vacuum area, an additional vacuum fitting 503 may be provided for applying vacuum thereto.

Figure 6:
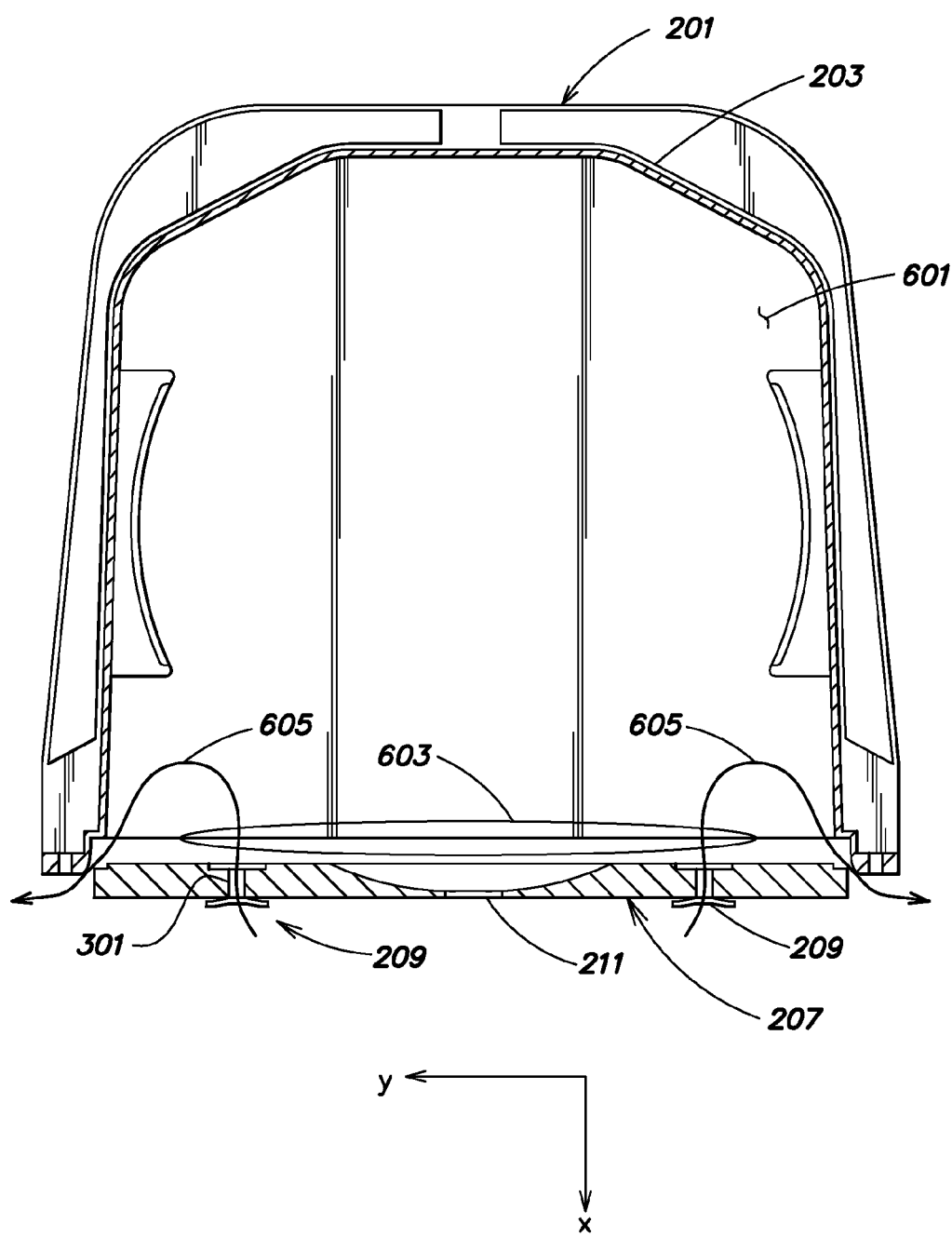
FIG. 6 is cross-sectional top view of the substrate carrier of FIG. 2 in accordance with an embodiment of the present invention.

FIG. 6 is cross-sectional top view of the substrate carrier 201 in accordance with an embodiment of the present invention. With reference to FIG. 6, the door 207 of the substrate carrier 201 is being removed (e.g., via the plate 401 (not shown)). As stated, the door 207 may be opened to insert a substrate into and/or extract a substrate from a storage region 601 of the substrate carrier 201 during semiconductor device manufacturing. As the door 207 is removed, the door 207 may move along the x-axis. As the door 207 is being removed, a region of low pressure 603 having a volume equal to a volume of the displaced door 207 is created. In conventional semiconductor device manufacturing systems and as previously described with reference to FIG. 1, as a substrate carrier door 109 (FIG. 1) is removed, ambient air (e.g., ISO Class 1000) flows around the door 109 into the substrate carrier 103 to occupy any such a low-pressure region.

In contrast, according to the present methods and apparatus, gas (e.g., purge gas) is delivered to the substrate carrier 201 via the one or more purge ports 209 before, during and/or after the door 207 is opened. The purge gas fills the low pressure region 603. For example, a volume of purge gas may be delivered such that a positive pressure is created inside the substrate carrier 201. The purge gas increases the pressure inside the substrate carrier 201 such that the pressure within the substrate carrier 201 is greater than ambient pressure. Therefore, gas flows from inside to outside the substrate carrier 201 as the door 207 is opened. Consequently, excess purge gas delivered to the substrate carrier 201 through the purge ports 209 may be expelled from the substrate carrier 201 around the edges of the substrate carrier door 207 as the door 207 is opened. FIG. 6 illustrates an exemplary flow 605 of such gas into and from the substrate carrier 201. Other flow patterns may be used.

Additionally, excess purge gas may be expelled from the exhaust port 211 as the door 207 is opened. Further, while purge gas for creating a positive pressure inside the substrate carrier 201 is delivered, the exhaust port 211 may expel purge gas from the substrate carrier 201 to prevent over-pressurization inside the substrate carrier 201. In this manner, the exhaust port 211 may serve as an over-pressure relief valve.

As purge gas is delivered through the one or more purge ports 209, such as while the door 207 is opened, a vacuum may be delivered via the vacuum opening 405 (FIG. 4B) of the plate 401 to the sealed volume between the plate 401, door 207, and first and second seals 303, 305. As stated, the vacuum resists a force created by flowing the purge gas into the center opening 301 of the purge port 209, thereby securing the door 207 to the plate 401.

Figure 7:
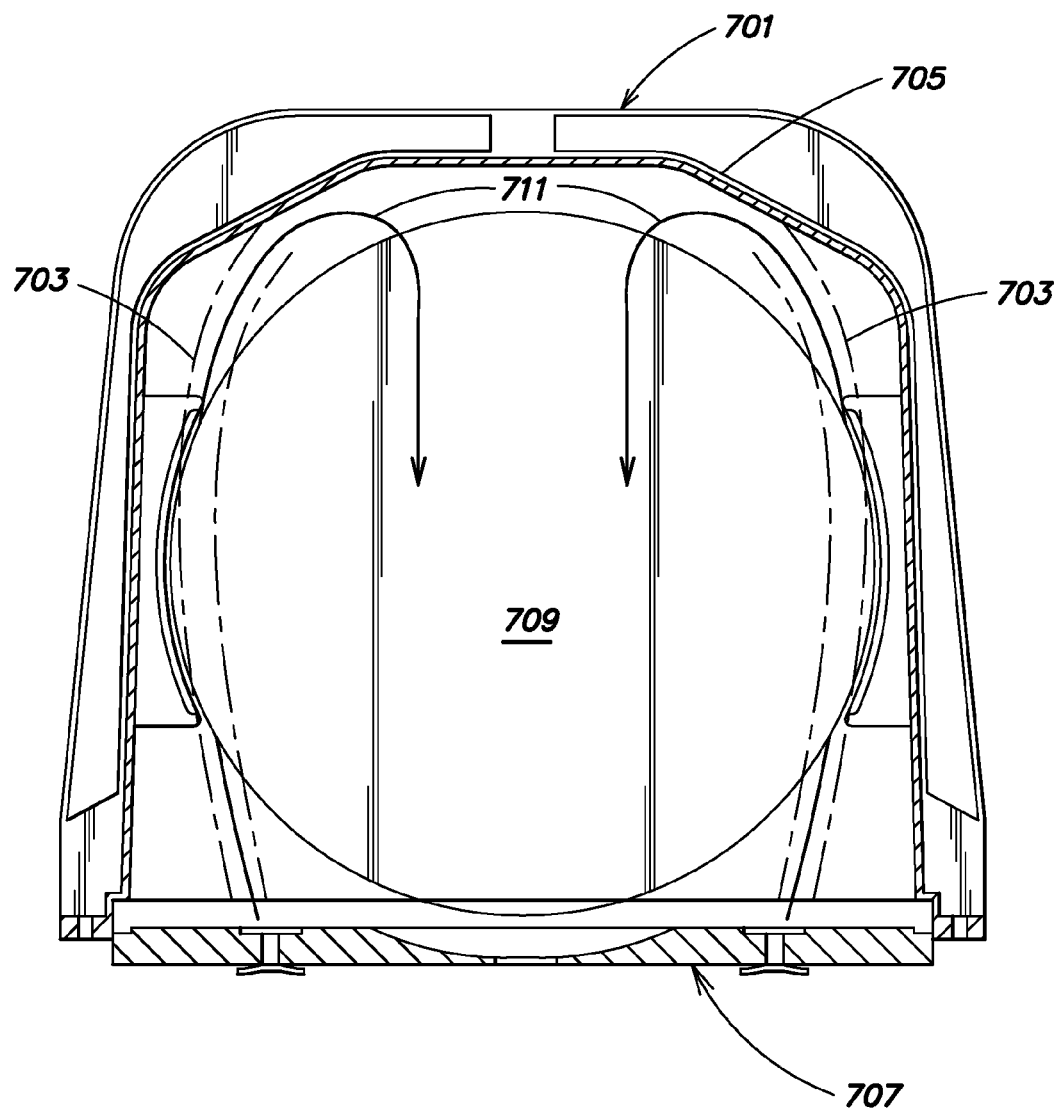
FIG. 7 illustrates exemplary purge gas flow in a second exemplary substrate carrier in accordance with an embodiment of the present invention.

FIG. 7 illustrates exemplary purge gas flow in a second exemplary substrate carrier 701 in accordance with an embodiment of the present invention. With reference to FIG. 7, the second exemplary substrate carrier 701 is similar to the substrate carrier 201 of FIGS. 2-3B and 5-6. However, in contrast to the substrate carrier 201 of FIGS. 2-3B and 5-6, the second exemplary substrate carrier 701 includes one or more features, such as channels or baffles 703 (shown in phantom).

(For example, the channels or baffles 703 may be positioned along and/or formed within a bottom interior surface, top interior surface and/or side of an enclosure 705 of the second exemplary substrate carrier 701). The one or more channels or baffles 703 may be shaped and/or positioned differently.

In some embodiments, the second exemplary substrate carrier 701 may create a laminar flow of the purge gas inside the substrate carrier 701. Further, as a door 707 of the second exemplary substrate carrier 701 is opened, the channels or baffles 703 may cause purge gas delivered inside the second exemplary substrate carrier 701 to flow from the front to the back of the substrate carrier 701 below a substrate 709 stored in the substrate carrier 701 and from the back to the front of the substrate carrier 701 over the substrate 709 (or vice versa). Preferably, purge gas flow around the substrate 709 may be uniform. The above gas flow may release loose particles from a surface of the substrate 709. FIG. 7 illustrates an exemplary flow 711 of gas in the substrate carrier 701. Other flow patterns may be used. For instance, the channels or baffles 703 may deliver a gas to the back of the substrate carrier 701 that (simultaneously) flows toward the front of the substrate carrier 701 over both the top and bottom surfaces of the substrate 709.

The foregoing description discloses only exemplary embodiments of the invention. Modifications of the above disclosed apparatus and methods which fall within the scope of the invention will be readily apparent to those of ordinary skill in the art. For instance, although the substrate carrier 201, 701 is shown as a Front Opening Unified Pod (FOUP), in some embodiments, other types of substrate carriers, such as top-opening or bottom-opening substrate carriers may be employed. Further, although in some embodiments, the plate 401 is included in a loadport, the plate 401 may be included in any support structure to which a substrate carrier 201, 701 couples. Although the present methods and apparatus are described with reference to a small lot sized substrate carrier, substrate carriers of any size may employ the present methods and apparatus.

In some embodiments, the purge ports 209 may be used to fill the substrate carrier 201, 701 with inert gas (e.g., N2, argon, etc.) after substrates are processed, placed in the carrier 201, 701 and the door 207, 707 is closed. In this way, the substrates are stored in an environment that does not allow oxidation of the films on the substrates (e.g., to prevent degradation of the films due to prolonged exposure to air). Similarly, in some embodiments, the purge ports 209 and/or the exhaust port 211 may be used to evacuate the substrate carrier 201, 701 after substrates are processed, placed in the substrate carrier 201, 701 and the door 207, 707 is closed. The purge ports 209 then may be used to re-introduce air into the carrier 201, 701 when the carrier 201, 701 is ready to be opened again.

As used herein, a "small lot" size substrate carrier refers to a substrate carrier that is adapted to hold a maximum of significantly fewer substrates than a conventional "large lot" size substrate carrier which typically holds 13 or 25 substrates. As an example, in one embodiment, a small lot size substrate carrier is adapted to hold a maximum of 5 or less substrates. Other small lot size substrate carriers may be employed (e.g., small lot size carriers that hold a maximum of 1, 2, 3, 4, 5, 6, 7 or more substrates, but significantly less than that of a large lot size substrate carrier). For example, in one embodiment, each small lot size substrate carrier may hold too few substrates for human transport of substrates carriers to be viable within a semiconductor device manufacturing facility.

Accordingly, while the present invention has been disclosed in connection with exemplary embodiments thereof, it should be understood that other embodiments may fall within the spirit and scope of the invention, as defined by the following claims.

The invention claimed is:

1. A loadport, comprising:
   a) a plate adapted to couple to a door of a substrate carrier to open the substrate carrier;
   a first opening of the plate adapted to couple to a first port in the door of the substrate carrier on a first side of the plate and to couple to a gas source on a second side of the plate, the first port having a first seal adapted to allow the gas source to seal to the first port, and
   wherein the loadport is adapted to allow a flow of gas from the gas source into the substrate carrier via the first opening in the plate and the first port in the door;
   b) a second opening of the plate adapted to couple to the first port in the door of the substrate carrier on the first side of the plate and to couple to a vacuum source on the second side of the plate, the first port having a second seal disposed concentrically around the first seal and adapted to seal to the vacuum source disposed concentrically around the gas source while gas flows into the substrate carrier,
   wherein the second opening is disposed so that a volume of gas disposed around the first opening may be evacuated on the first side of the plate, the volume of gas is defined by the first seal sealing the first opening to the first port and the second seal disposed around the first seal and sealing the second opening to the first port, the force exerted by the vacuum exceeding the force exerted by the flow of gas into the substrate carrier.

2. The loadport of claim 1, further including an exhaust channel, and
   wherein the plate further includes a third opening coupled to the exhaust channel on the second side of the plate and to a second port on the substrate carrier on the first side of the plate.

3. The loadport of claim 2 wherein the third opening is adapted to expel gas from inside the substrate carrier.

4. The loadport of claim 1 further comprising a gas fitting coupled to the first opening.

5. The loadport of claim 4 wherein the gas fitting is adapted to deliver gas into the substrate carrier via the first opening.

6. the loadport of claim 5 wherein the gas is a pressurized purge gas.

7. The loadport of claim 6 wherein the gas is one of nitrogen, argon, clean dry air, an inert gas or a nonreactive gas.

8. The loadport comprising:
   a docking surface adapted to support a substrate carrier;
   a plate adapted to couple to a door of the substrate carrier to open the substrate carrier, the plate includes a plurality of openings adapted to couple to one or more ports in the door of the substrate carrier, and
   wherein the loadport is adapted to allow a flow of gas into the substrate carrier directly from a first opening of the plurality of openings in the plate and a first port of the one or more ports in the door of the substrate carrier, the first opening adapted to couple to the first port in the door of the substrate carrier on an inner side of the plate and to couple to a gas source on an outer side of the plate, the first port having a first seal adapted to allow the gas source to seal to the first opening, the first port having a second seal disposed concentrically around the first seal and adapted to seal to a vacuum source disposed concentrically around the gas source while gas flows into the substrate carrier, wherein the loadport is adapted to allow the flow of gas out of the enclosure of the substrate carrier via a second opening of the plurality of openings in the plate and the first port, the second opening adapted to couple to the first port in the door of the substrate carrier on the inner side of the plate and to couple to the vacuum source on the outer side of the plate.

9. The loadport of claim 8 further including an exhaust channel, wherein the plurality of openings includes a third opening coupled to the exhaust channel on the outer side of the plate and to a second port of the one or more ports in the door of the substrate carrier on the inner side of the plate.

10. The loadport of claim 9 further comprising a gas fitting coupled to the outer side of the first opening.

11. The loadport of claim 10 wherein the gas fitting is adapted to deliver gas into the substrate carrier via the first opening.

12. The loadport of claim 11 wherein the gas is a pressurized purge gas.

\* \* \* \* \*